United States Patent
Ho et al.

(10) Patent No.: US 9,154,083 B2
(45) Date of Patent: *Oct. 6, 2015

(54) AMPLIFIER, FULLY-DIFFERENTIAL AMPLIFIER AND DELTA-SIGMA MODULATOR

(71) Applicant: MediaTek Inc., Hsin-Chu (TW)

(72) Inventors: Chen-Yen Ho, New Taipei (TW);
Chi-Lun Lo, Taoyuan (TW);
Hung-Chieh Tsai, Tainan (TW);
Yu-Hsin Lin, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/643,240

(22) Filed: Mar. 10, 2015

(65) Prior Publication Data

US 2015/0180420 A1   Jun. 25, 2015

Related U.S. Application Data

(63) Continuation of application No. 14/134,944, filed on Dec. 19, 2013, now Pat. No. 9,007,249, which is a continuation of application No. 13/590,491, filed on Aug. 21, 2012, now Pat. No. 8,638,250.

(60) Provisional application No. 61/675,922, filed on Jul. 26, 2012, provisional application No. 61/527,844, filed on Aug. 26, 2011.

(51) Int. Cl.
*H03M 3/00* (2006.01)
*H03F 1/02* (2006.01)
*H03F 3/45* (2006.01)

(52) U.S. Cl.
CPC .......... *H03F 1/0205* (2013.01); *H03F 3/45179* (2013.01); *H03M 3/50* (2013.01); *H03F 2200/18* (2013.01); *H03F 2203/45022* (2013.01)

(58) Field of Classification Search
CPC ................ H03F 2200/294; H03F 2203/30021; H03F 1/486; H03F 2200/261; H03F 2200/36; H03F 2200/405; H03F 2200/408; H03F 2200/411; H03F 1/02; H03F 3/26; H03F 1/307; H03F 3/30; H03F 1/083; H03F 5/00; H03F 1/30; H03F 2200/451; H03F 2203/21103; H03F 2203/21139; H03F 2203/30033
USPC ................... 341/143, 144, 155; 330/255, 265
See application file for complete search history.

(56) References Cited

U.S. PATENT DOCUMENTS 3,898,575 A   8/1975   Koch
6,462,620 B1   10/2002   Dupuis et al.
(Continued)

FOREIGN PATENT DOCUMENTS

CN   101252431   8/2008

*Primary Examiner* — Jean B Jeanglaude
(74) *Attorney, Agent, or Firm* — McClure, Qualey & Rodack, LLP

(57) ABSTRACT

An amplifier includes a front-end gain stage and an AC-coupled push-pull output stage. The AC-coupled push-pull output stage includes a first transistor, having a source, a drain and a gate, wherein the source of the first transistor is coupled to a first voltage level. The AC-coupled push-pull output stage further includes a second transistor, having a source, a drain and a gate, wherein the source of the second transistor is coupled to a second voltage level, the gate of the second transistor is coupled to the front-end gain stage, and the drain of the second transistor is coupled to the drain of the first transistor to form an output terminal of the amplifier. Further, the AC-coupled push-pull output stage includes an AC-coupled capacitor, which is a passive two terminal electrical component coupled between the front-end gain stage and the gate of the first transistor.

12 Claims, 5 Drawing Sheets

(56) References Cited

U.S. PATENT DOCUMENTS

| | | |
|---|---|---|
| 7,368,984 B2 | 5/2008 | Kim |
| 7,786,800 B2 | 8/2010 | Chang |
| 8,330,541 B2 * | 12/2012 | Cerutti .................. 330/207 A |
| 2007/0171112 A1 | 7/2007 | Park |
| 2011/0309884 A1 | 12/2011 | Dishop |

* cited by examiner

AMPLIFIER, FULLY-DIFFERENTIAL AMPLIFIER AND DELTA-SIGMA MODULATOR

CROSS REFERENCE TO RELATED APPLICATIONS

This application is a Continuation of pending U.S. patent application Ser. No. 14/134,944 filed Dec. 19, 2013, which is a Continuation of pending U.S. patent application Ser. No. 13/590,491 filed Aug. 21, 2012 (now U.S. Pat. No. 8,638,250, issued on Jan. 28, 2014), which claims the benefit of U.S. Provisional Applications No. 61/527,844 filed Aug. 26, 2011 and No. 61/675,922 filed Jul. 26, 2012, the entireties of which are incorporated by reference herein.

BACKGROUND OF THE INVENTION

1. Field of the Invention

The present invention relates to an amplifier, a fully-differential amplifier and a delta-sigma modulator, and in particular relates to a push-pull amplifier design.

2. Description of the Related Art

Amplifiers are among the most widely used electronic devices today, used in a vast array of consumer, industrial and scientific devices. When designing an amplifier, several considerations should be taken into account, including power efficiency, output driving capability, circuit size and operational speed and so on. An amplifier design with high power efficiency, reliable output driving capability, a small circuit size and fast operational speed is called for.

BRIEF SUMMARY OF THE INVENTION

An amplifier, a fully-differential amplifier and a delta-sigma modulator are disclosed.

An amplifier in accordance with an exemplary embodiment of the invention comprises a front-end gain stage, an AC-coupled push-pull output stage and a compensation circuit. The AC-coupled push-pull output stage comprises a first transistor, a second transistor, an AC-coupled capacitor and a resistance component. The first transistor has a source, a drain and a gate, wherein the source of the first transistor is coupled to a first voltage level. The second transistor has a source, a drain and a gate, wherein the source of the second transistor is coupled to a second voltage level, the gate of the second transistor is coupled to the front-end gain stage, and the drain of the second transistor is coupled to the drain of the first transistor to form an output terminal of the amplifier. The AC-coupled capacitor (which is a passive two terminal electrical component rather than a stray or parasitic capacitance of a transistor) is coupled between the front-end gain stage and the gate of the first transistor. By the resistance component, the gate of the first transistor is coupled to a bias voltage level, and, the compensation circuit is coupled between the front-end gain stage and the output terminal of the amplifier.

In another exemplary embodiment, a fully-differential amplifier is introduced, wherein the aforementioned AC-coupled push-pull output stage is used in both the positive and negative outputs of the fully-differential amplifier.

In another exemplary embodiment, a delta-sigma modulator is provided. The delta-sigma modulator comprises a feed-forward loop filter, a quantizer, a z-delay component, a first digital-to-analog converter and a second digital-to-analog converter. The quantizer is coupled after the feed-forward loop filter. The z-delay component couples an output signal of the quantizer to the first and second digital-to-analog converters, respectively, to feedback control the feed-forward loop filter and the quantizer. The feed-forward loop filter comprises a plurality of integrators, wherein at least one of the plurality of integrators comprises the aforementioned fully-differential amplifier.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
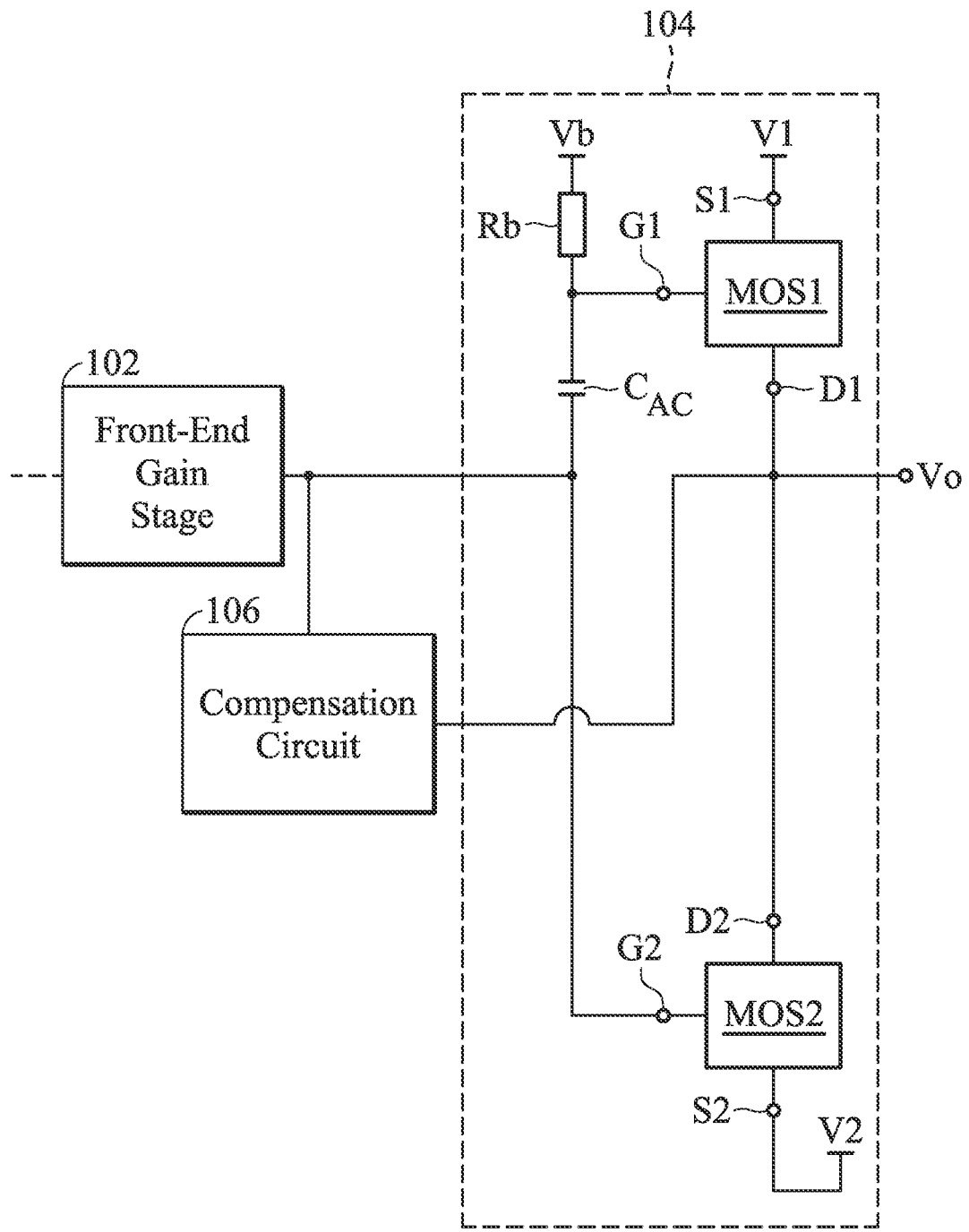
FIG. 1 depicts an amplifier in accordance with an exemplary embodiment of the invention, which includes the disclosed AC-coupled push-pull output stage having an AC-coupled capacitor (which is a passive two terminal electrical component rather than a stray or parasitic capacitance of a transistor) coupled between the front-end gain stage and a gate of a top or a bottom transistor of a push-pull structure.

FIG. 1 depicts an amplifier in accordance with an exemplary embodiment of the invention, which comprises a front-end gain stage 102, an AC-coupled push-pull output stage 104 and a compensation circuit 106. The AC-coupled push-pull output stage 104 comprises a transistor MOS1, a transistor MOS2, an AC-coupled capacitor $C_{AC}$ and a resistance component Rb. In the disclosed push-pull structure, the transistor MOS1 may be considered as a top transistor (e.g., a P-type transistor) to pull up the output voltage when the transistor MOS2 is considered as a bottom transistor (e.g., an N-type transistor) to push down the output voltage. Or, on the contrary, the transistor MOS1 may be considered as the bottom transistor when the transistor MOS2 is considered as the top transistor. The transistor MOS1 has a source S1, a drain D1 and a gate G1, wherein the source S1 of the transistor MOS1 is coupled to a voltage level V1. The transistor MOS2 has a source S2, a drain D2 and a gate G2, wherein the source S2 of the transistor MOS2 is coupled to a voltage level V2, the gate G2 of the transistor MOS2 is coupled to the front-end gain stage 102, and the drain D2 of the transistor MOS2 is coupled to the drain D1 of the transistor MOS1 to form an output terminal Vo of the amplifier. The AC-coupled capacitor $C_{AC}$ is coupled between the front-end gain stage 102 and the gate G1 of the transistor MOS1. Via the resistance component Rb, the gate G1 of the transistor MOS1 is coupled to a bias voltage level Vb. The compensation circuit 106 is coupled between the front-end gain stage 102 and the output terminal Vo of the amplifier.

Note that the AC-coupled capacitor $C_{AC}$ is a passive two terminal electrical component rather than a stray or parasitic capacitance of a transistor. Via the AC-coupled capacitor $C_{AC}$, DC (Direct Current) signals from the front-end gain stage 102 may be removed while AC (Alternating Current) signals from the front-end gain stage 102 are coupled to the gate G1 of the transistor MOS1 to drive the transistor MOS1 as a signal amplifying design rather than just a bias design. Thus, a push-pull structure is established. Because the AC-coupled capacitor $C_{AC}$ is a passive two terminal electrical component rather than a stray or parasitic capacitance of a transistor, the control design of the disclosed amplifier is much easier in comparison with the conventional Class AB amplifiers which use transistors (including stray capacitances and parasitic capacitances which introduce unexpected poles into the control system) to couple a front-end stage to a push-pull structure of the output stage. The disclosed AC-coupled push-pull output stage (e.g. 104 of FIG. 1) is suitable for high frequency or large swing applications and is capable of driving a heavy load.

The resistance component Rb may be a resistor. Note that the bias design of the transistor MOS1 (referring to the resistance component Rb which couples the bias voltage level Vb to the gate G1 of the transistor MOS1) is not in the signal path between the front-end gain stage 102 and the pus-pull structure. Thus, in comparison to the conventional Class AB amplifiers, the disclosed amplifier design results in a higher phase margin and is more stable.

Figure 2A:
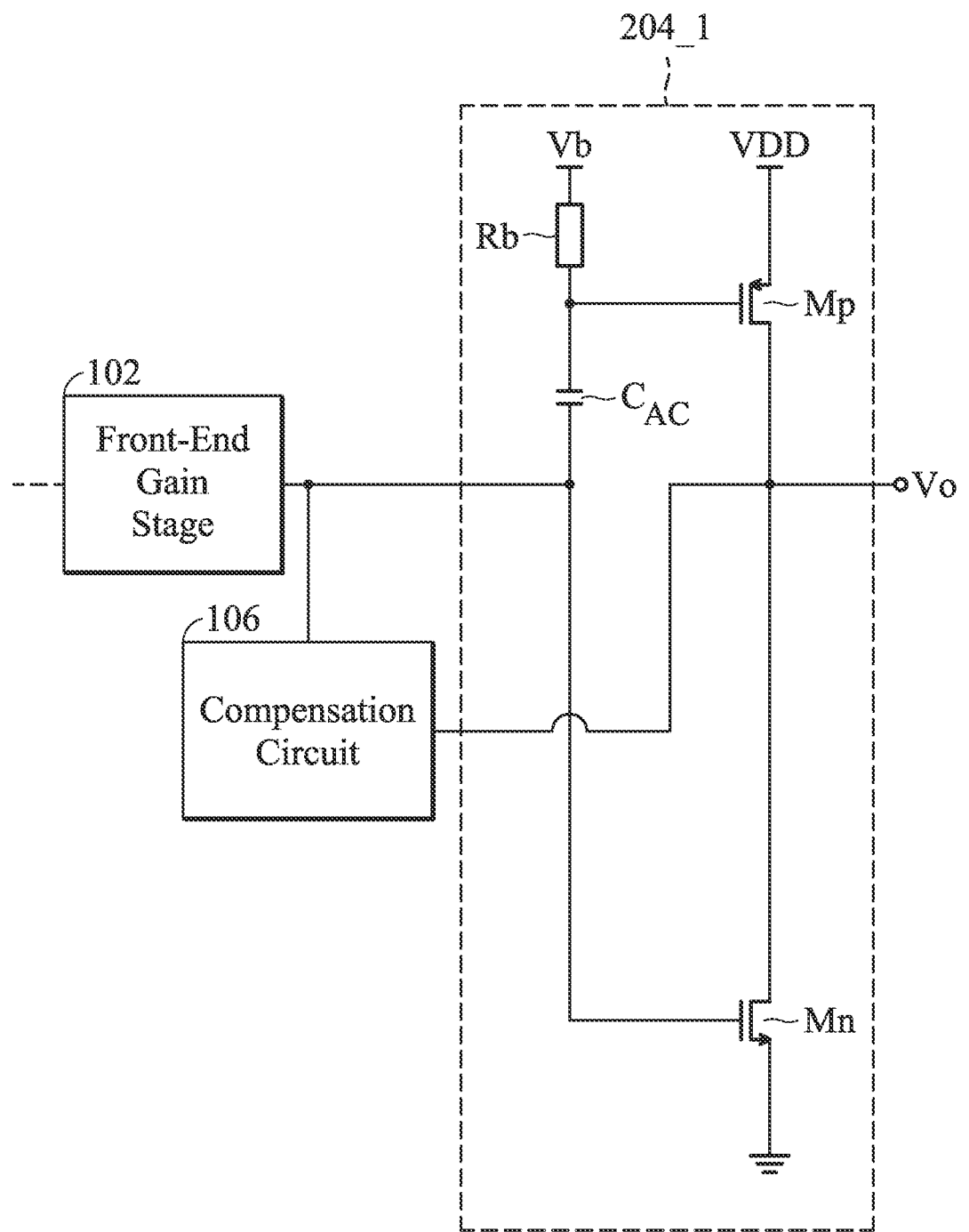
FIG. 2A depicts an amplifier in accordance with an exemplary embodiment of the invention, wherein the AC-coupled capacitor is coupled between the front-end gain stage and the gate of the top transistor of the push-pull structure.

FIG. 2A depicts an amplifier in accordance with an exemplary embodiment of the invention, which includes an AC-coupled push-pull output stage 204_1. In this embodiment shown in FIG. 2A, a P-type transistor Mp (or considered as a top transistor of a push-pull structure) acts as the transistor MOS1 of FIG. 1 and an N-type transistor Mn (or considered as a bottom transistor of a push-pull structure) acts as the transistor MOS2 of FIG. 1. A voltage source VDD coupled with the source of the top transistor Mp provides the voltage level V1 mentioned in FIG. 1, which is higher than a ground level coupled with the source of the bottom transistor Mn. The ground level act as the voltage level V2 mentioned in FIG. 1. In this embodiment, the AC-coupled capacitor $C_{AC}$ is coupled between the front-end gain stage 102 and the gate of the top transistor Mp of the push-pull structure.

Figure 2B:
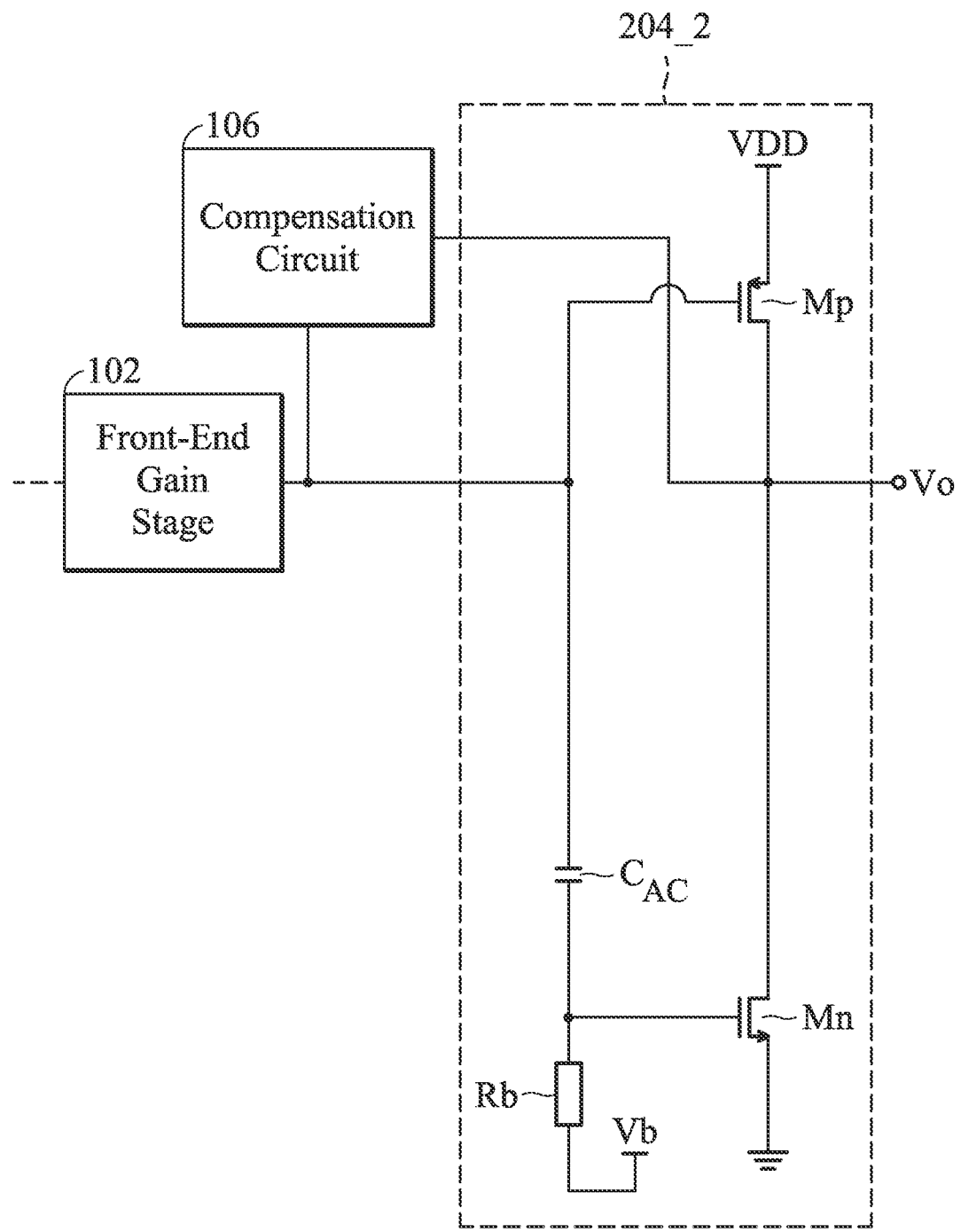
FIG. 2B depicts an amplifier in accordance with an exemplary embodiment of the invention, wherein the AC-coupled capacitor is coupled between the front-end gain stage and the gate of the bottom transistor of the push-pull structure.

FIG. 2B depicts an amplifier in accordance with another exemplary embodiment of the invention, which includes an AC-coupled push-pull output stage 204_2. In this embodiment shown in FIG. 2B, a P-type transistor Mp (or considered as a top transistor of a push-pull structure) acts as the transistor MOS2 shown in FIG. 1 and an N-type transistor Mn (or considered as a bottom transistor of a push-pull structure) acts as the transistor MOS1 shown in FIG. 1. A voltage source VDD coupled with the source of the top transistor Mp provides the voltage level V2 mentioned in FIG. 1. A ground level coupled with the source of the bottom transistor Mn is considered as the voltage level V1 of FIG. 1. In this embodiment, the voltage level V1 (i.e. the ground level) is lower than the voltage level V2 (i.e. provided from the voltage source VDD). The AC-coupled capacitor $C_{AC}$ is coupled between the front-end gain stage 102 and the gate of the bottom transistor Mn of the push-pull structure.

In another exemplary embodiment, a fully-differential amplifier is introduced, wherein the AC-coupled push-pull output stage 104 of FIG. 1 is used in both the positive and negative outputs of the fully-differential amplifier.

Figure 3:
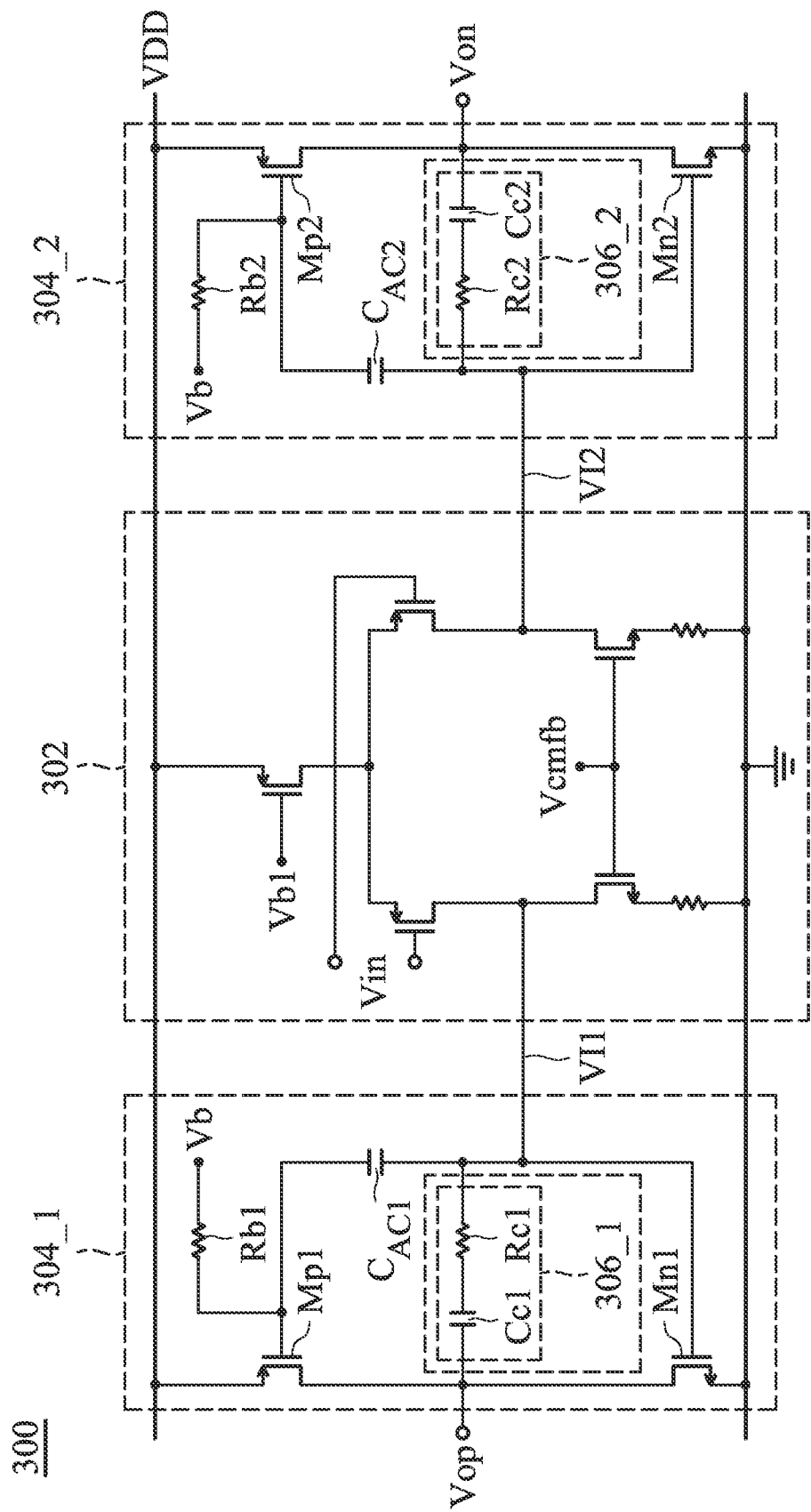
FIG. 3 depicts a fully-differential amplifier in accordance with an exemplary embodiment of the invention.

FIG. 3 depicts a fully-differential amplifier 300 in accordance with an exemplary embodiment of the invention, which comprises a front-end gain stage 302, two AC-coupled push-pull output stages 304_1 and 304_2 and two compensation circuits 306_1 and 306_2. The front-end gain stage 302, biased by voltages Vb1 and Vcmfb, receives and amplifies a differential input signal Vin and outputs the amplified signal at a terminal VI1 and a terminal VI2 in a differential form. The AC-coupled push-pull output stage 304_1 and the compensation circuit 306_1 are provided for the positive output (Vop) of the fully differential amplifier 300. The AC-coupled push-pull output stage 304_2 and the compensation circuit 306_2 are provided for the negative output (Von) of the fully differential amplifier 300.

Referring to the positive output (Vop), the AC-coupled push-pull output stage 304_1 comprises a transistor Mp1, a transistor Mn1, an AC-coupled capacitor $C_{AC}1$ and a resistance component Rb1. The transistors Mp1 and Mn1 form a push-pull-structure. The AC-coupled capacitor $C_{AC}1$ is coupled between the terminal VI1 and the gate of the transistor Mp1. The resistance component Rb1 couples the gate of the transistor Mp1 to a bias voltage level Vb. The compensation circuit 306_1 is implemented by a Miller compensation circuit (including a capacitor Cc1 and a resistor Rc1).

Referring to the negative output (Von), the AC-coupled push-pull output stage 304_2 comprises a transistor Mp2, a transistor Mn2, an AC-coupled capacitor $C_{AC}2$ and a resistance component Rb2. The transistors Mp2 and Mn2 form a push-pull-structure. The AC-coupled capacitor $C_{AC}2$ is coupled between the terminal VI2 and the gate of the transistor Mp2. The resistance component Rb2 couples the gate of the transistor Mp2 to the bias voltage level Vb. The compensation circuit 306_2 is implemented by a Miller compensation circuit (including a capacitor Cc2 and a resistor Rc2).

The fully-differential amplifier is not limited to that shown in FIG. 3. In another exemplary embodiment, the last stages of the positive and negative outputs of the fully-differential amplifier may be implemented to include the AC-coupled push-pull output stage shown in FIG. 2B. Further, the compensation circuits of the disclosure are not limited to the Miller compensation circuits 306_1 and 306_2.

Figure 4:
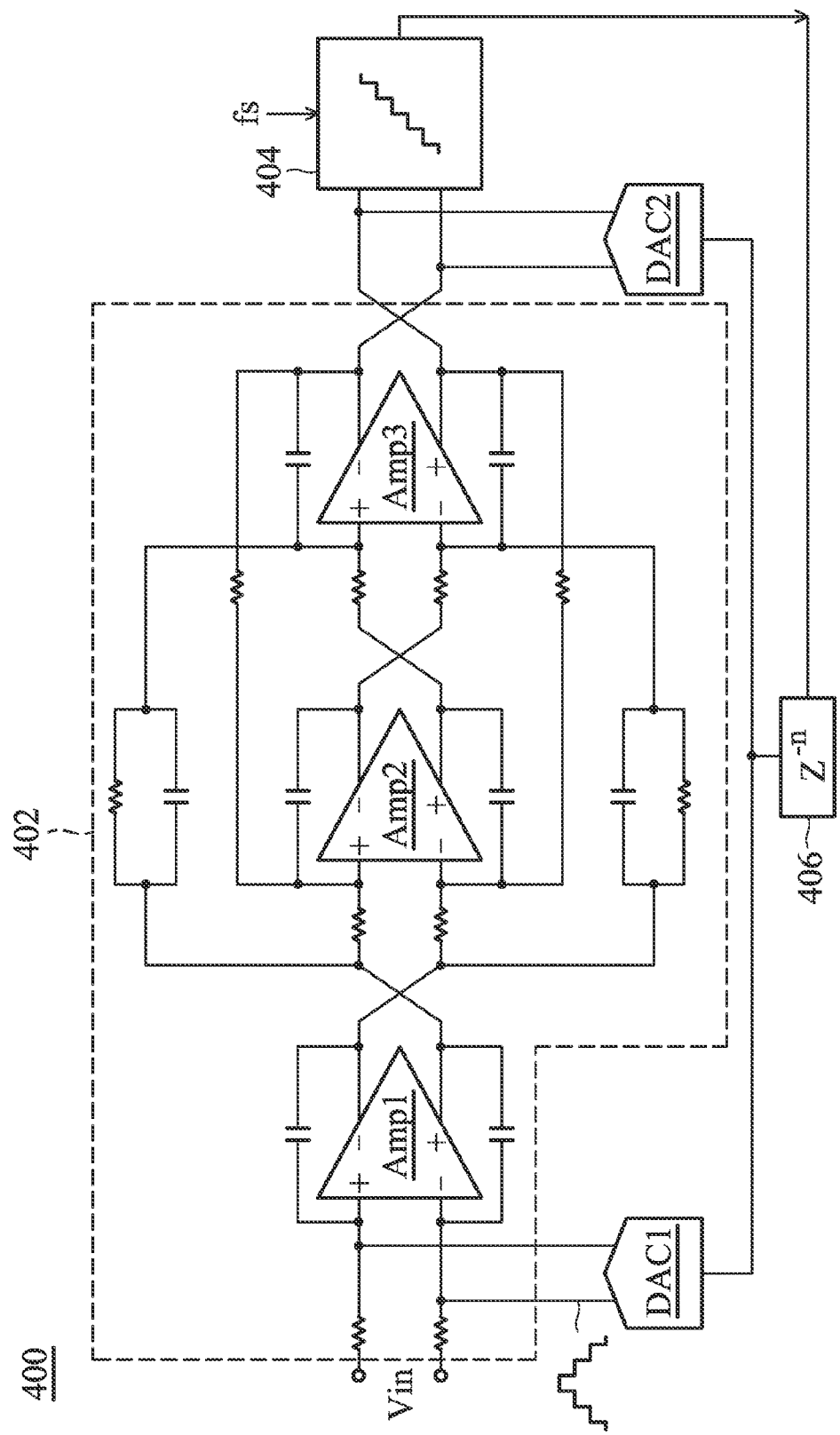
FIG. 4 depicts a delta-sigma modulator in accordance with an exemplary embodiment of the invention.

FIG. 4 depicts a delta-sigma modulator 400 in accordance with an exemplary embodiment of the invention. The delta-sigma modulator 400 comprises a feed-forward loop filter 402, a quantizer 404 (with a sampling rate fs), a z-delay component 406 and digital-to-analog converters DAC1 and DAC2. The quantizer 404 is coupled after the feed-forward loop filter 402. The z-delay component 406 couples an output signal of the quantizer 404 to the digital-to-analog converters DAC1 and DAC2, respectively, to feedback control the feed-forward loop filter 402 and the quantizer 404. Note that the feed-forward loop filter 402 comprises a plurality of integrators (each including an amplifier, referring to Amp1 to Amp3). At least one of the amplifiers Amp1 to Amp3 is implemented by the fully-differential amplifier of the disclosure (e.g., the amplifier 300 shown in FIG. 3).

Between the plurality of integrators, a first-stage integrator (including the amplifier Amp1) first coupled to the digital-to-analog converter DAC1 may be confronted by a significant signal swing. Thus, in an exemplary embodiment, the amplifier Amp1 is specially implemented by the fully-differential amplifier of the disclosure (e.g., the amplifier 300 shown in FIG. 3) to cope with the significant signal swing.

The amplifier design is not limited to implementation only in the delta-sigma modulator. The amplifier or fully-differential amplifier may be used in other electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
    a front-end gain stage; and
    an AC-coupled push-pull output stage, comprising:
        a first transistor, having a source, a drain and a gate, wherein the source of the first transistor is coupled to a first voltage level;
        a second transistor, having a source, a drain and a gate, wherein the source of the second transistor is coupled to a second voltage level, the gate of the second transistor is coupled to the front end gain stage, and the drain of the second transistor is coupled to the drain of the first transistor to form an output terminal of the amplifier; and
        an AC-coupled capacitor, which is a passive two terminal electrical component coupled between the front-end gain stage and the gate of the first transistor.

2. The amplifier as claimed in claim 1, further comprising:
    a resistance component, coupling the gate of the first transistor to a bias voltage level.

3. The amplifier as claimed in claim 1, further comprising:
    a compensation circuit, coupled between the front-end gain stage and the output terminal of the amplifier.

4. The amplifier as claimed in claim 1, wherein:
    the first transistor is a P-type transistor;
    the second transistor is an N-type transistor; and
    the first voltage level is higher than the second voltage level.

5. The amplifier as claimed in claim 1, wherein:
    the first transistor is an N-type transistor;
    the second transistor is a P-type transistor; and
    the first voltage level is lower than the second voltage level.

6. A fully-differential amplifier, comprising:
    a front-end gain stage, having a first terminal and a second terminal outputting a differential signal that has been amplified by the front-end gain stage;
    a first AC-coupled push-pull output stage, comprising:
        a first transistor, having a source, a drain and a gate, wherein the source of the first transistor is coupled to a first voltage level;
        a second transistor, having a source, a drain and a gate, wherein the source of the second transistor is coupled to a second voltage level, the gate of the second transistor is coupled to the first terminal of the front-end gain stage, and the drain of the second transistor is coupled to the drain of the first transistor to form a first output terminal of the fully-differential amplifier; and
        a first AC-coupled capacitor, coupled between the first terminal of the front-end gain stage and the gate of the first transistor; and
    a second AC-coupled push-pull output stage, comprising:
        a third transistor, having a source, a drain and a gate, wherein the source of the third transistor is coupled to the first voltage level;
        a fourth transistor, having a source, a drain and a gate, wherein the source of the fourth transistor is coupled to the second voltage level, the gate of the fourth transistor is coupled to the second terminal of the front-end gain stage, and the drain of the fourth transistor is coupled to the drain of the third transistor to form a second output terminal of the fully-differential amplifier; and
        a second AC-coupled capacitor, coupled between the second terminal of the front-end gain stage and the gate of the third transistor;
    wherein the fully-differential amplifier outputs a differential output signal via the first and second output terminals.

7. The fully-differential amplifier as claimed in claim 6, wherein:
    the first AC-coupled push-pull output stage further comprises a first resistance component, coupling the gate of the first transistor to a bias voltage level; and
    the second AC-coupled push-pull output stage further comprises a second resistance component, coupling the gate of the third transistor to the bias voltage level.

8. The fully-differential amplifier as claimed in claim 6, further comprising:
    a first compensation circuit, coupled between the first terminal of the front-end gain stage and the first output terminal of the fully-differential amplifier; and
    a second compensation circuit, coupled between the second terminal of the front-end gain stage and the second output terminal of the fully differential amplifier.

9. The fully-differential amplifier as claimed in claim 6, wherein:
    the first and third transistors are P-type transistors;
    the second and fourth transistors are N-type transistors; and
    the first voltage level is higher than the second voltage level.

10. The fully-differential amplifier as claimed in claim 6, wherein:
    the first and third transistors are N-type transistors;
    the second and fourth transistors are P-type transistors; and
    the first voltage level is lower than the second voltage level.

11. A delta-sigma modulator, comprising:
    a feed-forward loop filter, comprising a plurality of integrators, wherein at least one of the plurality of integrators comprises the fully-differential amplifier as claimed in claim 5;
    a quantizer coupled after the feed-forward loop filter; and
    a z-delay component and a first digital-to-analog converter and a second digital-to-analog converter, wherein the z-delay component couples an output signal of the quantizer to the first and second digital-to-analog converters, respectively, to feedback control the feed-forward loop filter and the quantizer.

12. The delta-sigma modulator as claimed in claim 11, wherein a first-stage integrator between the plurality of integrators comprises the fully-differential amplifier.

* * * * *